(12) United States Patent
Cho et al.

(10) Patent No.: US 10,265,742 B2
(45) Date of Patent: Apr. 23, 2019

(54) METHOD FOR IN-SITU CHAMBER CLEAN USING CARBON MONOXIDE (CO) GAS UTLIZED IN AN ETCH PROCESSING CHAMBER

(71) Applicant: Applied Materials, Inc., Santa Clara, CA (US)

(72) Inventors: Kee Young Cho, San Jose, CA (US); Sang Wook Kim, Palo Alto, CA (US); Joo Won Han, Santa Clara, CA (US); Han Soo Cho, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 988 days.

(21) Appl. No.: 14/522,864

(22) Filed: Oct. 24, 2014

(65) Prior Publication Data

US 2015/0144154 A1 May 28, 2015

Related U.S. Application Data

(60) Provisional application No. 61/908,614, filed on Nov. 25, 2013.

(51) Int. Cl.
*B08B 7/00* (2006.01)
*C11D 11/00* (2006.01)
*C23C 16/44* (2006.01)
*H01J 37/32* (2006.01)

(52) U.S. Cl.
CPC ........ *B08B 7/0035* (2013.01); *C11D 11/0041* (2013.01); *C23C 16/4405* (2013.01); *H01J 37/32862* (2013.01)

(58) Field of Classification Search
None
See application file for complete search history.

(56) References Cited

U.S. PATENT DOCUMENTS

| 4,659,426 | A | | 4/1987 | Fuller et al. |
| 5,817,578 | A | * | 10/1998 | Ogawa ................ B08B 7/0035 |
| | | | | 134/1.1 |
| 7,544,621 | B2 | | 6/2009 | Chen et al. |
| 2006/0191555 | A1 | * | 8/2006 | Yoshida ............... B08B 7/0035 |
| | | | | 134/1.1 |
| 2009/0139540 | A1 | * | 6/2009 | Lau ..................... B08B 7/0035 |
| | | | | 134/1.1 |
| 2011/0130007 | A1 | | 6/2011 | Ching et al. |
| 2013/0087174 | A1 | | 4/2013 | Sun et al. |
| 2014/0083453 | A1 | * | 3/2014 | Yin ..................... C23C 16/4405 |
| | | | | 134/1.1 |
| 2015/0144154 | A1 | | 5/2015 | Cho et al. |

* cited by examiner

*Primary Examiner* — Eric W Golightly
*Assistant Examiner* — Arlyn I Rivera-Cordero
(74) *Attorney, Agent, or Firm* — Patterson + Sheridan, LLP

(57) ABSTRACT

Embodiments of the disclosure generally relate to methods of removing etch by-products from the plasma processing chamber using carbon monoxide or carbon dioxide. In one embodiment, a method for dry cleaning a processing chamber includes exposing a chamber component disposed within the processing chamber in absence of a substrate disposed therein to a first cleaning gas mixture comprising carbon monoxide or carbon dioxide, wherein a portion of the chamber component has a film layer or residues deposited thereon, and the film layer or residues comprises a refractory metal and/or a metal silicide.

22 Claims, 2 Drawing Sheets

METHOD FOR IN-SITU CHAMBER CLEAN USING CARBON MONOXIDE (CO) GAS UTLIZED IN AN ETCH PROCESSING CHAMBER

CROSS-REFERENCE TO RELATED APPLICATIONS

This application claims benefit of U.S. provisional patent application Ser. No. 61/908,614, filed Nov. 25, 2013, which is herein incorporated by reference.

BACKGROUND

Field

Embodiments of the disclosure generally relate to methods for in-situ dry cleaning a plasma processing chamber.

Description of the Related Art

Refractory metal and metal silicide are widely used in ultra-large scale integration (ULSI) circuits for gate structure and interconnect. To fabricate gate electrodes, the device must be dry etched at points in the manufacturing process. This includes interaction with bromine, fluorine and chlorine, among other harsh chemistries. After dry etching these materials, however, metal containing by-products and/or residues may gradually build up on the surfaces of the chamber components of the processing chamber which in turn affects the ability to maintain process control during circuit fabrication and therefore the subsequent process. Accumulation of such by-products or residues also becomes a source of unwanted particles that may contaminate the substrate. These metal containing by-products or residues cannot be effectively removed by conventional in-situ chamber clean process using fluorine or chlorine based plasma since they also produce non-volatile by-products which remain on the etched surface of the chamber components. The chamber clean process may require complicated and long process, which affects the process throughput.

Therefore, there is a need for an improved process for cleaning plasma processing chamber after etching of a substrate.

SUMMARY

Embodiments of the disclosure include methods for in-situ chamber dry cleaning a plasma processing chamber. In one embodiment, a method for dry cleaning a processing chamber is provided. The method includes exposing a chamber component disposed within the processing chamber in absence of a substrate disposed therein to a first cleaning gas mixture comprising carbon monoxide or carbon dioxide, wherein a portion of the chamber component has a film layer or residues deposited thereon, and the film layer or residues comprises a refractory metal and/or a metal silicide.

In another embodiment, a method for in-situ chamber dry cleaning a processing chamber is provided. The method includes exposing a chamber component disposed within the processing chamber in absence of a substrate disposed therein to a first plasma formed from a first cleaning gas mixture comprising carbon monoxide or carbon dioxide, wherein a portion of the chamber component has a film layer or residues deposited thereon, and the film layer or residues comprises a refractory metal and/or a metal silicide, exposing the chamber component disposed within the processing chamber in absence of the substrate disposed therein to a second plasma formed from a second cleaning gas mixture comprising at least a boron containing gas and a fluorine containing gas, and exposing the chamber component disposed within the processing chamber in absence of the substrate disposed therein to a third plasma formed from a third cleaning gas mixture comprising at least a fluorine-carbon containing gas.

In yet another embodiment, a method for in-situ chamber dry cleaning a processing chamber is provided. The method includes supplying a first cleaning gas mixture comprising carbon monoxide or carbon dioxide into the processing chamber in absence of a substrate disposed therein, wherein a chamber component disposed within the processing chamber has a refractory metal and/or metal silicide residues deposited thereon, supplying a second cleaning gas mixture comprising at least a boron containing gas and a fluorine containing gas into the processing chamber in absence of the substrate disposed therein, and supplying a third cleaning gas mixture comprising at least a fluorine-carbon containing into the processing chamber in absence of the substrate disposed therein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure provide methods for an in-situ chamber cleaning process. The in-situ cleaning process effectively remove etch by-products, particularly refractory metal and/or metal silicide residues, from the plasma processing chamber without damaging chamber components. The in-situ cleaning process may be performed in any suitable plasma processing chamber, such as a Decoupled Plasma Source (DPS), DPS-II, or DPS Plus, DPS DT, or AdvantEdge etch reactor of a CENTURA® etch system, a HART etch reactor, and a HART TS etch reactor, all of which are available from Applied Materials, Inc., of Santa Clara, Calif. It is contemplated that other plasma processing chambers, including those produced by other manufacturers, may benefit from embodiments described herein.

Figure 1:
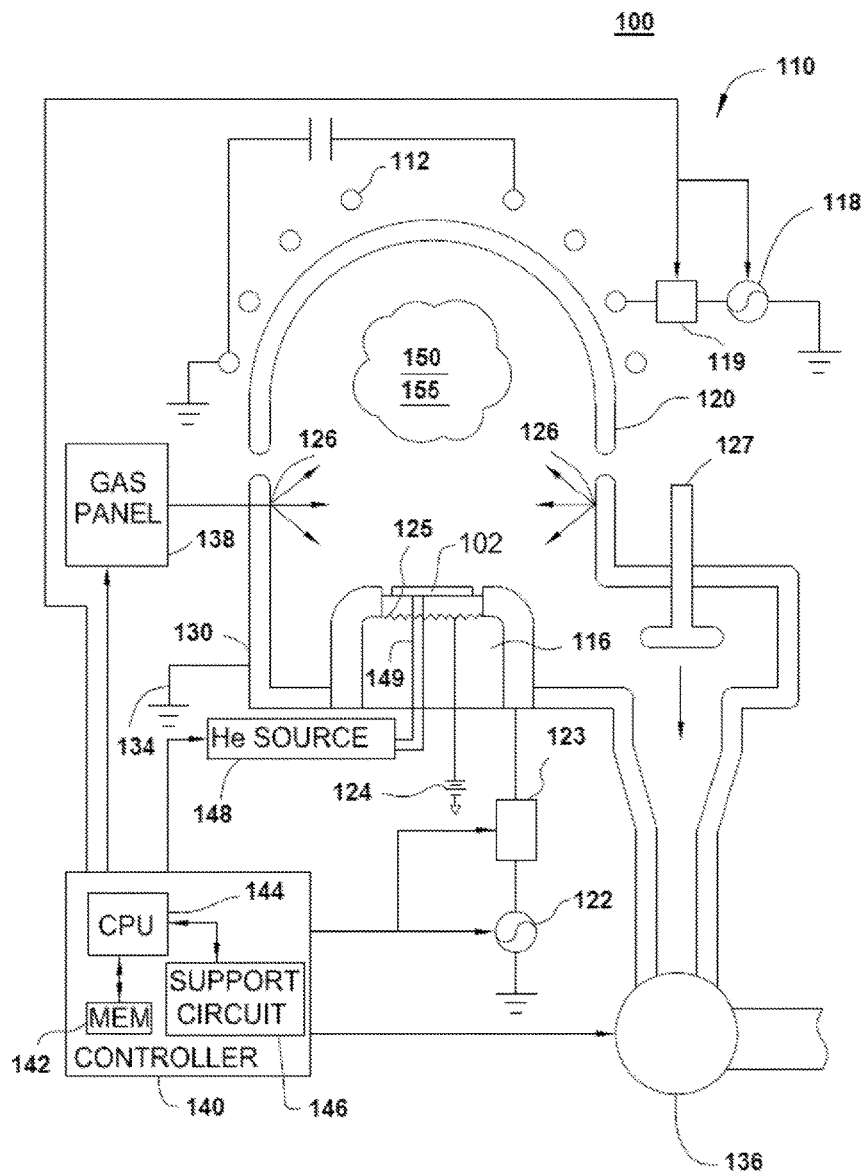
FIG. 1 depicts a schematic diagram of a plasma processing chamber that may be used to practice the disclosure.

FIG. 1 depicts a schematic diagram of one embodiment of an illustrative etch processing chamber 100 suitable for practicing the disclosure. The chamber 100 includes a conductive chamber wall 130 that supports a dielectric dome-shaped ceiling (referred hereinafter as the dome 120). The ceiling may have a flat or any other shape. The chamber wall 130 is connected to an electrical ground 134.

At least one inductive coil antenna segment 112 is coupled to a radio-frequency (RF) source 118 through a matching network 119. The antenna segment 112 is positioned exterior to a ceiling 120 and is utilized to maintain a plasma formed from process gases within the chamber. In one embodiment, the source RF power applied to the inductive coil antenna 112 is in a range between about 0 Watts to about 1500 Watts at a frequency between about 50 kHz and about 13.56 MHz. In another embodiment, the source RF power applied to the inductive coil antenna 112 is in a range between about 100 Watts to about 800 Watts, such as at about 400 Watts.

The processing chamber 100 also includes a substrate support pedestal 116 (biasing element) that is coupled to a second (biasing) RF source 122 that is generally capable of producing an RF signal to generate a bias power about 1500 Watts or less (e.g., no bias power) at a frequency of approximately 13.56 MHz. The biasing source 122 is coupled to the substrate support pedestal 116 through a matching network 123. The bias power applied to the substrate support pedestal 116 may be DC or RF.

In operation, a substrate 102 is placed on the substrate support pedestal 116 and is retained thereon by conventional techniques, such as electrostatic chucking, vacuum or mechanical clamping, during an etching process. Gaseous components are supplied from a gas panel 138 to the processing chamber 100 through entry ports 126 to form a gaseous mixture 150. A plasma, formed from the mixture 150, is maintained in the processing chamber 100 by applying RF power from the RF sources 118 and 122, respectively, to the antenna 112 and the substrate support pedestal 116. The pressure within the interior of the processing chamber 100 is controlled using a throttle valve 127 situated between the processing chamber 100 and a vacuum pump 136. The temperature at the surface of the chamber walls 130 is controlled using liquid-containing conduits (not shown) that are located in the chamber walls 130 of the processing chamber 100.

The temperature of the substrate 102 is controlled by stabilizing the temperature of the support pedestal 116 and flowing a heat transfer gas from source 148 via conduit 149 to channels formed by the back of the substrate 102 and grooves (not shown) on the pedestal surface. Helium gas may be used as the heat transfer gas to facilitate heat transfer between the substrate support pedestal 116 and the substrate 102. During the etch process, the substrate 102 is heated by a resistive heater 125 disposed within the substrate support pedestal 116 to a steady state temperature via a DC power source 124. Helium disposed between the pedestal 116 and substrate 102 facilitates uniform heating of the substrate 102. Using thermal control of both the dome 220 and the substrate support pedestal 116, the substrate 102 may be maintained at a temperature of between about 100 degrees Celsius and about 500 degrees Celsius.

Those skilled in the art will understand that other forms of etch chambers may be used to practice the disclosure. For example, chambers with remote plasma sources, microwave plasma chambers, electron cyclotron resonance (ECR) plasma chambers, and the like may be utilized to practice the disclosure.

A controller 140, including a central processing unit (CPU) 144, a memory 142, and support circuits 146 for the CPU 144 is coupled to the various components of the etch processing chamber 100 to facilitate control of the etch process. To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. Etching and cleaning methods, such as described herein, is generally stored in the memory 142 as a software routine. The software routine may also be stored and/or executed by a second CPU (not shown) that is remotely located from the hardware being controlled by the CPU 144.

Figure 2:
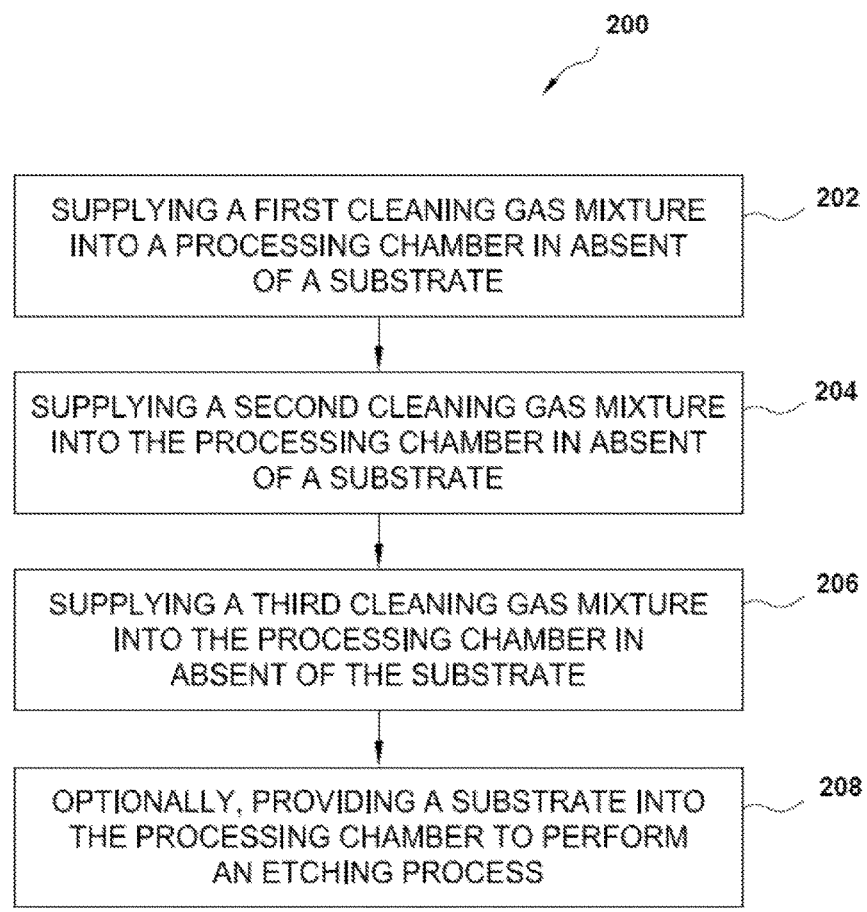
FIG. 2 depicts a flow chart of a method for cleaning a plasma processing chamber according to embodiments of the disclosure.

FIG. 2 illustrates a method 200 for cleaning a plasma processing chamber, such as the processing chamber 100 depicted in FIG. 1, according to embodiments of the present disclosure. Generally, the method 200 can be used to remove transition metals and transition metal compounds (including silicides, oxides, and nitrides) from the surface of the chamber components disposed within the plasma processing chamber. Particularly, the method 200 is used to remove metal containing by-products, such as refractory metal or metal silicide residues, from an interior of the plasma processing chamber using a plasma formed from one or more cleaning gas mixtures. The method 200 begins at block 202 by supplying a first cleaning gas mixture into the plasma processing chamber without the substrate being present. The interior of the plasma processing chamber, including chamber walls, substrate pedestal, liner, or other chamber components disposed in the plasma processing chamber, may have unwanted film accumulation or contamination disposed thereon. The film accumulation or contamination may include refractory metal and/or metal silicide residues from the previous etching processes. Exemplary refractory metal may be a forth period material, a fifth period material, or a sixth period material. Refractory metals may include, but are not limited to titanium (Ti), vanadium (V), chromium (Cr), zirconium (Zr), hafnium (Hf), ruthenium (Ru), osmium (Os), iridium (Ir), niobium (Nb), molybdenum (Mo), tantalum (Ta), tungsten (W), rhenium (Re), cobalt (Co), and nickel (Ni). In some embodiments, the refractory metal layer may include a composite of a fifth period material and a sixth period material, a composite of two or more fifth period materials, a composite of two or more fifth period materials or sixth period materials, or another metal, such as aluminum. Exemplary metal silicides may include, but are not limited to cobalt silicide ($CoSi_2$), titanium silicide ($TiSi_2$), nickel silicide ($NiSi_2$), tantalum silicide ($TaSi_2$), tungsten silicide ($WSi_2$), molybdenum silicide ($MoSi_2$), or platinum silicide ($PtSi_2$).

A plasma, formed from the first cleaning gas mixture, etches or removes contaminates or film accumulation that may include at least one or more refractory metal and/or metal silicide residues discussed above from the interior of the plasma processing chamber, thereby preventing unwanted particulate from falling on the substrate disposed on the substrate pedestal during the subsequent etching processes. In one embodiment, the first cleaning gas mixture includes at least a carbonyl group containing gas. In one embodiment, the first cleaning gas mixture includes carbon monoxide or carbon dioxide. The first cleaning gas mixture containing a carbonyl group containing gas or carbon monoxide (or carbon dioxide) has been observed by the inventors to be effective in cleaning the chamber components contaminated by the refractory metal and/or metal silicide residues. It is believed that carbon monoxide or carbonyl ions dissociated from the carbonyl group containing gas or carbon monoxide can chemically react with refractory metal or metal silicide residues and form a volatile metal carbonyl, which can be readily pumped out of the processing chamber. For example, in cases where carbon monoxide (CO) based chemistry is used to plasma etch the contaminates or film accumulation containing nickel metal, the volatile by-products formed using CO gas would be nickel carbonyl $Ni(CO)_4$. The foregoing chemical reaction is expressed by Equation (1):

$$Ni + 4CO \rightarrow Ni(CO)_4 \quad \text{Equation (1)}$$

Similarly, if the contaminates or film accumulation contains cobalt metal, for example, the by-products formed using CO gas may include $Co_2(CO)_8$ and $[Co(CO)_4]^-$ etc., which are volatile and can be quickly removed which, in turn, results in significantly lower defect levels.

In some embodiments, the first cleaning gas mixture may also include an inert gas such as helium, argon, or other suitable gases to help control the etching process (e.g., control the rate of metal carbonyl removal) and/or maintain a particular chamber condition. The plasma may be formed using the carbonyl group containing gas or carbon monoxide as discussed above, or the plasma may be formed using the inert gas. When an inert gas is used as the plasma initiating gas, the carbonyl group containing gas or carbon monoxide may then be delivered to the plasma.

In some embodiments, the first cleaning gas mixture may further include a halogen containing gas. Suitable examples of the halogen containing gas may include, but are not limited to, a chlorine containing gas ($Cl_2$), boron chloride ($BCl_3$), silicon tetrachloride ($SiCl_4$), hydrogen chloride (HCl), hydrogen bromide (HBr), nitrogen trifluoride ($NF_3$), sulfur hexafluoride gas ($SF_6$), tetrafluoromethane gas ($CF_4$) and the like. Flowing of the halogen containing gas with the carbonyl group containing gas may be beneficial because carbon monoxide or carbonyl ions dissociated from the carbonyl group containing gas can chemically react with the halogen containing gas and/or free radicals or ionic species formed in the plasma from the halogen containing gas and form carbonyl halides. The carbonyl halides then react with the refractory metal and/or metal silicide residues to carry it off as a gaseous metal carbonyl halide.

During cleaning for supplying the first cleaning gas mixture, several process parameters may be controlled. In one embodiment, the microwave power may be supplied to the plasma processing chamber between about 200 Watt and about 2000 Watt, such as about 1000 Watts. The pressure of the processing chamber may be controlled at between about 0.5 milliTorr and about 500 milliTorr, such as between about 5 milliTorr and about 50 milliTorr, for example about 10 milliTorr. The carbonyl group containing gas or carbon monoxide gas supplied in the first cleaning gas mixture may be controlled at a flow rate between about 10 sccm and about 200 sccm, for example about 50 sccm. The inert gas supplied in the first cleaning gas mixture may be controlled at a flow rate between about 10 sccm to about 500 sccm, for example about 100 sccm. If the halogen containing gas is used, the halogen containing gas supplied in the first cleaning gas mixture may be controlled at a flow rate between about 10 sccm and about 300 sccm, for example about 200 sccm. In some embodiments, the carbonyl group containing gas or carbon monoxide gas and the inert gas supplied in the first cleaning gas mixture is controlled at a ratio between about 1:5 to about 1:40, such as about 1:10 to about 1:20, for example about 1:15. In some embodiments, the carbonyl group containing gas or carbon monoxide gas and the halogen containing gas supplied in the first cleaning gas mixture is controlled at a ratio between about 1:0.1 to about 1:10, such as about 1:0.5 to about 1:5, for example about 1:2. The cleaning process may be performed between about 5 seconds and about 500 seconds. While the microwave power is discussed, it is contemplated that an RF power source may be used.

The endpoint for supplying the first cleaning gas into the processing chamber may be by time mode or other suitable endpoint technique. In one embodiment, after the first cleaning gas mixture is supplied to the processing chamber for between about 5 seconds and about 500 seconds, the supply of the first cleaning gas may be terminated.

At block 204, a second cleaning gas mixture is supplied into the plasma processing chamber. A plasma, formed from the second cleaning gas mixture, is then used to continue cleaning or removing the remaining residuals, including other types of residuals, from the interior of the plasma processing chamber. The second cleaning gas mixture may be provided after the flow of the first cleaning gas mixture has terminated or the flows may be gradually transitioned. In one embodiment, the second cleaning gas mixture includes at least a boron containing gas. In another embodiment, the second cleaning gas mixture includes a mixture of at least the boron containing gas and a fluorine containing gas. In yet another embodiment, the second cleaning gas mixture includes a mixture of at least the boron containing gas, the fluorine containing gas, and a halogen containing gas. In cases where the halogen containing gas were introduced in the previous step (i.e., block 202), the halogen containing gas may continue to flow in the plasma processing chamber without interruption. It is believed that the boron elements contained in the boron containing gas assist removing the metal contaminates, such as Ti, Ta, Al, or Hf containing materials, from the interior of the plasma processing chamber. However, excess boron elements remaining in the processing chamber may cause boron particles or boron residuals to adversely attack chamber components, such as the electrostatic chuck of the substrate support pedestal. Accordingly, the fluorine containing gas supplied in the first cleaning gas mixture may efficiently remove excess boron elements to prevent the chamber components from attack. Furthermore, the halogen containing gas supplied in the first cleaning gas mixture may assist removing metal contaminates, such as Ti, Ta, Al, or Hf containing materials, as well as other residuals from the processing chamber. As the contaminates and/or film accumulation remaining in the interior of the processing chamber may also includes sources from other materials, such as a photoresist layers (e.g., a carbon based material) or nitrogen or oxygen containing material, the halogen containing gas as supplied for cleaning may efficiently react and the remove the these residuals from the plasma processing chamber.

In one embodiment, the boron containing gas supplied in the first cleaning gas mixture may include $BCl_3$, $BH_3$, $B_2H_6$, or other suitable boron containing gas and the like. The fluorine containing gas may generally have a formula of $C_xF_y$, or $C_xH_yF_z$, wherein the x, y, z are integers greater than or at least 1. In one embodiment, the fluorine containing gas as used in the first cleaning gas mixture may be selected from a group consisting of $CF_4$, $CHF_3$, $CH_2F_2$, $C_2F_6$, $C_2F_8$, $SF_6$, $NF_3$ and the like. The halogen containing gas may be selected from a group consisting of $Cl_2$, HCl, $SiCl_4$, or other suitable chlorine containing gases and the like. In one example, the boron containing gas supplied in the first cleaning gas mixture is $BCl_3$, the fluorine containing gas supplied in the first cleaning gas mixture is $CF_4$ and the halogen containing gas supplied in the first cleaning gas mixture is $Cl_2$.

During cleaning for supplying the second cleaning gas mixture, several process parameters may be controlled. In one embodiment, the microwave power may be supplied to the plasma processing chamber between about 200 Watt and about 2000 Watt, such as about 1000 Watts. The pressure of the processing chamber may be controlled at between about 0.5 milliTorr and about 500 milliTorr, such as between about 5 milliTorr and about 50 milliTorr, for example about 10 milliTorr. The boron containing gas supplied in the second cleaning gas mixture may be controlled at a flow rate between about 10 sccm and about 200 sccm, for example about 50 sccm. The fluorine containing gas supplied in the second cleaning gas mixture may be controlled at a flow rate between about 10 sccm to about 500 sccm, for example about 100 sccm. The halogen containing gas supplied in the second cleaning gas mixture may be controlled at a flow rate between about 10 sccm and about 300 sccm, for example about 200 sccm. In one embodiment, the boron containing gas and the fluorine containing gas supplied in the second cleaning gas mixture is controlled at a ratio between about 1:0.1 to about 1:10, such as about 1:0.5 to about 1:5, such as about 1:2. The process may be performed between about 5 seconds and about 500 seconds.

The endpoint for supplying the second cleaning gas mixture into the plasma processing chamber may be by time mode or other suitable endpoint technique. In one embodiment, after the second cleaning gas mixture is supplied to the processing chamber for between about 5 seconds and about 500 seconds, the supply of the second cleaning gas mixture may be terminated.

At block 206, a third cleaning gas mixture is supplied into the plasma processing chamber. A plasma, formed from the third cleaning gas mixture, is then used to continue removing remaining contaminates and film residuals from the interior of the plasma processing chamber. The third cleaning gas mixture may be provided after the flow of the second gas mixture has terminated, or the flows may be gradually transitioned. In one embodiment, the third cleaning gas mixture includes at least an oxygen containing gas. In another embodiment, the third cleaning gas mixture includes a mixture of at least the oxygen containing gas, a fluorine containing gas and a halogen containing gas. The halogen containing gas and the fluorine containing gas supplied in the third cleaning gas mixture may assist in removing the remaining residuals from the interior of the plasma processing chamber. The oxygen containing gas supplied in the third cleaning gas mixture may assist removing carbon containing residuals, such as carbon polymers from photoresist layer or mask layer, from the plasma processing chamber. If the fluorine containing gas and/or the halogen containing gas were introduced in the previous steps (i.e., blocks 202, 204), the fluorine containing gas and/or the halogen containing gas may continue to flow in the plasma processing chamber without interruption.

In one embodiment, the fluorine containing gas as used in the third cleaning gas mixture may generally have a formula of $C_xF_y$ or $C_xH_yF_z$, wherein x, y, z are integers greater than or at least 1. In one embodiment, the fluorine containing gas may be selected from a group consisting of $CF_4$, $CHF_3$, $CH_2F_2$, $C_2F_6$, $C_2F_8$, $SF_6$, and $NF_3$, and the like. The halogen containing gas may be selected from a group consisting of $Cl_2$, HCl, $SiCl_4$ or other suitable chlorine containing gases and the like. The oxygen containing gas may be supplied in the third cleaning gas mixture may include $O_2$, $N_2O$, $NO_2$, CO, $CO_2$ or other suitable gases. In one example, the oxygen containing gas supplied in the third cleaning gas mixture is $O_2$, the fluorine containing gas supplied in the third cleaning gas mixture is $CF_4$, and the halogen containing gas supplied in the third cleaning gas mixture is $Cl_2$. In another example, the oxygen containing gas supplied in the third cleaning gas mixture is carbon monoxide, the fluorine containing gas supplied in the third cleaning gas mixture is $CF_4$, and the halogen containing gas supplied in the third cleaning gas mixture is $Cl_2$.

During cleaning for supplying the third cleaning gas mixture, several process parameters may be controlled. In one embodiment, the microwave power may be supplied to the plasma processing chamber between about 200 Watt and about 2000 Watt, such as about 1000 Watts. The pressure of the processing chamber may be controlled at between about 0.5 milliTorr and about 500 milliTorr, such as between about 5 milliTorr and about 50 milliTorr, for example about 30 milliTorr. The halogen containing gas supplied in the third cleaning gas mixture may be controlled at a flow rate between about 5 sccm and about 500 sccm, for example about 50 sccm. The fluorine containing gas supplied in the third cleaning gas mixture may be controlled at a flow rate between about 0.5 sccm to about 500 sccm, for example about 180 sccm. The oxygen containing gas supplied in the third cleaning gas mixture may be controlled at a flow rate between about 0.5 sccm and about 500 sccm, for example about 60 sccm. In one embodiment, the halogen containing gas and the fluorine containing gas supplied in the third cleaning gas mixture controlled at a ratio between about 1:0.1 to about 1:10, such as about 1:0.5 to about 1:5, such as about 1:3.6. The process may be performed between about 5 seconds and about 500 seconds.

At block 208, after the third cleaning gas mixture supplied to the processing chamber is terminated and the cleaning process is completed, a substrate may be optionally transferred into the processing chamber for further processing such as an etching process.

It is contemplated that the process sequence of the method 200 as discussed above is merely illustrative and may vary depending upon the contaminations or residues to be removed. Therefore, the first cleaning gas mixture may be introduced into the plasma processing chamber after the second or third cleaning gas mixture. Alternatively, the second cleaning gas mixture may be introduced into the plasma processing chamber before or after the third cleaning gas mixture. In some embodiments, the first, second, and third cleaning gas mixtures may be introduced into the plasma processing chamber concurrently. In addition, while the in-situ cleaning process is discussed herein, any or all of the first, second, and third cleaning gas mixtures may be remotely generated and introduced into the plasma processing chamber in a predetermined sequence to remove the transition metal compound residues (including silicides, oxides, and nitrides) from the chamber components of the plasma processing chamber. In such a case, the first, second, and/or third cleaning gas mixtures may be generated and supplied into the plasma processing chamber in either a continuous mode or in a pulsed mode. In the embodiment where the cleaning gas mixture is supplied into the process chamber in a pulsed mode, the cleaning gas mixture may be pulsed into the process at about every 60 seconds. Each pulse can last about 30 seconds. The duty cycles may be controlled at about 1 percent and about 100 percent as needed. In some embodiments, the formation and delivery of the first, second, and third cleaning gas mixtures can be performed using the same or similar parameters, such that the first, second, and third activated plasma gases are formed at the same or similar temperature, pressure, power level, flow rate, or other parameters or any combination thereof. In some embodiments, the formation and delivery of the first, second, and third cleaning gas mixtures can be a continuous event. In this way, there is no vacuum break between each cleaning step and therefore the throughput is improved.

Benefits of the methods described herein include in-situ removing etch by-products, particularly refractory metal and/or metal silicide residues, re-deposits and film layer from the plasma processing chamber using at least a carbonyl group containing gas or carbon monoxide. The carbon monoxide or carbonyl ions dissociated from the carbonyl group containing gas or carbon monoxide chemically react with refractory metal or metal silicide residues and form a volatile metal carbonyl which can be readily pumped out of the processing chamber. The plasma processing chamber is therefore maintained in a desired clean condition.

While the foregoing is directed to embodiments of the present disclosure, other and further embodiments of the disclosure may be devised without departing from the basic scope thereof, and the scope thereof is determined by the claims that follow.

The invention claimed is:

1. A method for in-situ chamber dry cleaning a processing chamber, comprising:
   (A) supplying a first cleaning gas mixture comprising carbon monoxide or carbonyl ions into the processing chamber in absence of a substrate disposed therein, wherein a chamber component disposed within the processing chamber has a metal silicide deposited thereon;
   after performing (A), (B): supplying a second cleaning gas mixture comprising at least a boron containing gas and a fluorine containing gas at a ratio of about 1:0.5 to about 1:5 into the processing chamber in absence of the substrate disposed therein; and
   after performing (B), (C): supplying a third cleaning gas mixture comprising at least a chlorine-containing gas and a fluorine-carbon containing gas at a ratio of about 1:0.5 to about 1:5 into the processing chamber in absence of the substrate disposed therein.

2. The method of claim 1, wherein the metal silicide is cobalt silicide ($CoSi_2$).

3. The method of claim 1, wherein the boron containing gas and the fluorine containing gas are supplied at a ratio of about 1:2.

4. The method of claim 3, wherein the chlorine-containing gas and the fluorine-carbon containing gas are supplied at a ratio of about 1:3.6.

5. A method for dry cleaning a processing chamber, comprising:
   (A): exposing a chamber component disposed within the processing chamber in absence of a substrate disposed therein to a first cleaning gas mixture comprising carbon monoxide or carbon dioxide, wherein a portion of the chamber component has a film layer or residue deposited thereon, and the film layer or residue comprises a metal silicide, or a metal silicide and a refractory metal;
   after performing (A), (B): exposing the chamber component disposed within the processing chamber in absence of the substrate to a second cleaning gas mixture comprising at least a boron containing gas; and
   after performing (B), (C): exposing the chamber component disposed within the processing chamber in absence of the substrate to a third cleaning gas comprising a mixture of at least an oxygen containing gas, a fluorine containing gas and a halogen containing gas.

6. The method of claim 5, wherein the refractory metal is selected from a group consisting of titanium (Ti), vanadium (V), chromium (Cr), zirconium (Zr), hafnium (Hf), ruthenium (Ru), osmium (Os), iridium (Ir), niobium (Nb), molybdenum (Mo), tantalum (Ta), tungsten (W), rhenium (Re), cobalt (Co), and nickel (Ni).

7. The method of claim 5, wherein the metal silicide comprises cobalt silicide ($CoSi_2$), titanium silicide ($TiSi_2$), nickel silicide ($NiSi_2$), tantalum silicide ($TaSi_2$), tungsten silicide ($WSi_2$), molybdenum silicide ($MoSi_2$), or platinum silicide ($PtSi_2$).

8. The method of claim 5, wherein the metal silicide is cobalt silicide ($CoSi_2$).

9. The method of claim 5, wherein the first cleaning gas mixture comprises carbon monoxide.

10. The method of claim 9, wherein the first cleaning gas mixture further comprises an inert gas and a halogen containing gas.

11. The method of claim 9, wherein the first cleaning gas mixture further comprises a fluorine containing gas.

12. The method of claim 9, wherein the first cleaning gas mixture further comprises a chlorine-containing gas.

13. The method of claim 9, wherein (A) further comprises:
   applying a microwave power into the processing chamber to form a plasma from the first cleaning gas mixture; and
   reacting the plasma with the film layer or residue deposited on the portion of the chamber component to form a volatile metal carbonyl.

14. A method for in-situ chamber dry cleaning a processing chamber, comprising:
   (A): exposing a chamber component disposed within the processing chamber in absence of a substrate disposed therein to a first plasma formed from a first cleaning gas mixture comprising carbon monoxide or carbon dioxide, wherein a portion of the chamber component has a film layer or residue deposited thereon, and the film layer or residue comprises a metal silicide, or a metal silicide and a refractory metal;
   after performing (A), (B): exposing the chamber component disposed within the processing chamber in absence of the substrate disposed therein to a second plasma formed from a second cleaning gas mixture comprising at least a boron containing gas and a fluorine containing gas; and
   after performing (B), (C): exposing the chamber component disposed within the processing chamber in absence of the substrate disposed therein to a third plasma formed from a third cleaning gas mixture comprising at least a fluorine-carbon containing gas.

15. The method of claim 14, wherein the refractory metal is selected from a group consisting of titanium (Ti), vanadium (V), chromium (Cr), zirconium (Zr), hafnium (Hf), ruthenium (Ru), osmium (Os), iridium (Ir), niobium (Nb), molybdenum (Mo), tantalum (Ta), tungsten (W), rhenium (Re), cobalt (Co), and nickel (Ni).

16. The method of claim 14, wherein the metal silicide comprises cobalt silicide ($CoSi_2$), titanium silicide ($TiSi_2$), nickel silicide ($NiSi_2$), tantalum silicide ($TaSi_2$), tungsten silicide ($WSi_2$), molybdenum silicide ($MoSi_2$), or platinum silicide ($PtSi_2$).

17. The method of claim 14, wherein the boron containing gas is selected from a group consisting of $BCl_3$, $BH_3$, and $B_2H_6$.

18. The method of claim 14, wherein the fluorine containing gas supplied in the second cleaning gas mixture is selected from a group consisting of $CF_4$, $CHF_3$, $CH_2F_2$, $C_2F_6$, $SF_6$, and $NF_3$.

19. The method of claim 14, wherein the fluorine-carbon containing gas supplied in the third cleaning gas mixture includes $CF_4$, $CHF_3$, $CH_2F_2$, and $C_2F_6$.

20. The method of claim 14, wherein the metal silicide is cobalt silicide ($CoSi_2$).

21. The method of claim 14, wherein the first cleaning gas mixture further comprises an inert gas and a halogen containing gas.

22. The method of claim 21, wherein the halogen containing gas comprises a chlorine containing gas ($Cl_2$), boron chloride ($BCl_3$), silicon tetrachloride ($SiCl_4$), hydrogen chloride (HCl), hydrogen bromide (HBr), nitrogen trifluoride ($NF_3$), sulfur hexafluoride gas ($SF_6$), or tetrafluoromethane gas ($CF_4$).

\* \* \* \* \*